United States Patent
You

(10) Patent No.: US 9,324,460 B1
(45) Date of Patent: Apr. 26, 2016

(54) REPAIR CIRCUIT, SEMICONDUCTOR MEMORY DEVICE AND METHOD OF OPERATING THE SAME

(71) Applicant: SK hynix Inc., Gyeonggi-do (KR)

(72) Inventor: Jung-Taek You, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/682,876

(22) Filed: Apr. 9, 2015

(30) Foreign Application Priority Data

Nov. 12, 2014 (KR) .................. 10-2014-0157042

(51) Int. Cl.
*G11C 29/04* (2006.01)
*G11C 29/00* (2006.01)

(52) U.S. Cl.
CPC .............. *G11C 29/781* (2013.01); *G11C 29/04* (2013.01)

(58) Field of Classification Search
None
See application file for complete search history.

(56) References Cited

U.S. PATENT DOCUMENTS 5,708,612 A * 1/1998 Abe .............. G11C 29/24
365/200

FOREIGN PATENT DOCUMENTS

KR 1020120087718 8/2012

* cited by examiner

*Primary Examiner* — James G Norman
(74) *Attorney, Agent, or Firm* — IP & T Group LLP

(57) ABSTRACT

A repair circuit includes a column repair signal generation block suitable for comparing an input address with respective first and second repair addresses in response to a mode control signal, and generating first and second column repair signals; a normal decoder suitable for accessing any one of a first normal column line corresponding to the input address and a second normal column line corresponding to an address that is different in terms of a most significant bit from the input address, in response to the first and second column repair signals; and a redundancy decoder suitable for decoding the first repair address in response to the first and second column repair signals, wherein the second repair address is generated by inverting a most significant bit of the first repair signal.

19 Claims, 5 Drawing Sheets

REPAIR CIRCUIT, SEMICONDUCTOR MEMORY DEVICE AND METHOD OF OPERATING THE SAME

CROSS-REFERENCE TO RELATED APPLICATIONS

The present application claims priority of Korean Patent Application No. 10-2014-0157042, filed on Nov. 12, 2014, which is incorporated herein by reference in its entirety.

BACKGROUND

1. Field

Exemplary embodiments of the present invention relate to a semiconductor design technology, and more particularly, to a device for reducing/minimizing a test time of a test operation in a semiconductor memory device including a repair circuit for repairing defective memory cells.

2. Description of the Related Art

FIG. 1 is a block diagram illustrating a conventional semiconductor memory device.

Referring to FIG. 1, the semiconductor memory device includes a normal cell array 110, a redundancy cell array 120, a column fuse block 130, a comparison block 140, a control block 150, a normal decoder 160, and a redundancy decoder 170.

The normal cell array 110 includes a plurality of memory cells which are disposed at each intersection of a plurality of row lines (not shown) and a plurality of column lines, respectively corresponding to a row address (not shown) and a column address YA.

The redundancy cell array 120 includes a plurality of memory cells for replacing defective memory cells.

The normal cell array 110 includes normal column lines corresponding to a plurality of normal column select signals NYI1 and NYI2, and the redundancy cell array 120 includes redundancy column lines corresponding to a plurality of redundancy column select signals RYI.

The column fuse block 130 includes a plurality of fuse sets, and outputs a fuse set enable signal YREN indicating that a defective unit cell exists among a plurality of unit cells and a repair address YRA for replacing a column address corresponding to the defective unit cell among the plurality of unit cells.

The comparison block 140 receives the fuse set enable signal YREN and the repair address YRA from the column fuse block 130 and receives the column address YA from outside. When the fuse set enable signal YREN is enabled, the comparison block 140 may compare the column address YA with the repair address YRA and output a column repair signal SYEB based on a comparison result. The column repair signal SYEB may indicate that a repair operation is necessary when the column address YA inputted from the outside corresponds to the defective unit cell.

The control block 150 may generate a normal column enable signal NCE for controlling the normal column line, in response to the column repair signal SYEB. The control block 150 disables the normal column enable signal NCE if the column repair signal SYEB is enabled.

The normal decoder 160 receives the column address YA, a mode control signal TM, and the normal column enable signal NCE. The semiconductor memory device performs a normal operation a first operation mode in which the mode control signal TM is disabled. Further, the semiconductor memory device performs a test operation by driving, not a single column line, but double column lines in a second operation mode in which the mode control signal TM is enabled.

The normal decoder 160 decodes the column address YA and enables the normal column select signals NYI1 and NYI2 when the normal column enable signal NCE is enabled in the first operation mode. The normal cell array 110 drives the normal column line corresponding to the normal column select signals NYI1 and NYI2.

The normal decoder 160 stops a decoding operation on the column address YA when the normal column enable signal NCE is disabled in the first operation mode.

The normal decoder 160 retains a most significant bit of the column address YA to a floating state, and decodes the column address YA and outputs the normal column select signals NYI1 and NYI2, when the normal column enable signal NCE is enabled in the second operation mode. Because the normal decoder 160 retains the most significant bit of the column address YA to the floating state, the normal column lines to be finally enabled may be first and second normal column lines corresponding to column addresses YA which are different in terms of only their most significant bits.

The normal decoder 160 stops the decoding operation on the column address YA when the normal column enable signal NCE is disabled in the second operation mode.

The redundancy decoder 170 receives and decodes the column repair signal SYEB, and enables the redundancy column select signal RYI corresponding to the column repair signal SYEB. The redundancy cell array 120 drives the redundancy column line corresponding to the enabled redundancy column select signal RYI.

Next, describing operations, the mode control signal TM is disabled in the first operation mode. The comparison block 140 receives the column address YA from the outside, receives the fuse set enable signal YREN and the repair address YRA outputted from the column fuse block 130, and compares the column address YA with the repair address YRA. When the column address YA is different from the repair address YRA, the column repair signal SYEB is disabled, and accordingly, the control block 150 enables the normal column enable signal NCE. The normal decoder 160 decodes the column address YA and outputs the normal column select signals NYI1 and NYI2. The normal cell array 110 drives the normal column line corresponding to the normal column select signals NYI1 and NYI2.

Conversely, when the column address YA is identical to the repair address YRA, the column repair signal SYEB is enabled. The redundancy decoder 170 may receive and decode the column repair signal SYEB, and output the redundancy column select signal RYI. The redundancy cell array 120 may enable the redundancy column line corresponding to the redundancy column select signal RYI. The control block 150, which receives the enabled column repair signal SYEB, disables the normal column enable signal NCE, and the normal decoder 160 stops the decoding operation in response to the disabled normal column enable signal NCE.

In the second operation mode, the mode control signal TM, which is enabled, is received by the normal decoder 160. The comparison block 140 receives the column address YA from the outside, receives the fuse set enable signal YREN and the repair address YRA outputted from the column fuse block 130, and compares the column address YA with the repair address YRA. When the column address YA is different from the repair address YRA, the column repair signal SYEB is disabled, and accordingly, the control block 150 enables the normal column enable signal NCE. The normal decoder 160 may retain the most significant bit of the column address YA in the floating state when the normal column enable signal NCE and the mode control signal TM are enabled, decode the received column address YA, and output the normal column select signals NYI1 and NYI2. The normal cell array 110 may enable the first and second normal column lines corresponding to the normal column select signals NYI1 and NYI2.

Conversely, when the column address YA is identical to the repair address YRA, the column repair signal SYEB is enabled. The redundancy decoder 170 may receive and decode the column repair signal SYEB, and output the redundancy column select signal RYI. The redundancy cell array 120 may enable the redundancy column line corresponding to the redundancy column select signal RYI. The control block 150, which receives the enabled column repair signal SYEB, disables the normal column enable signal NCE, and the normal decoder 160 stops the decoding operation in response to the disabled normal column enable signal NCE. That is, even when the mode control signal TM for the second operation mode is enabled, the normal decoder 160 may not perform the decoding operation since the normal column enable signal NCE is disabled.

When a fail does not occur in the first normal column line corresponding to the column address YA in the second operation mode in which a double column test operation is performed, a test operation may be performed by simultaneously enabling the first normal column line and the second normal column line. However, when a fail occurs in the first normal column line, a redundancy column line is enabled through a repair operation, and the second normal column line corresponding to the column address YA, which is different in terms of only the most significant bit thereof from the column address YA of the first normal column line, is disabled. Thus, in the second operation mode, when the repair operation is performed since a failure occurs in the first normal column line between the first and second normal column lines corresponding to the column addresses YA different in terms of only their most significant bits, a test operation may not be simultaneously performed on the remaining second normal column line.

In the conventional semiconductor memory device, when a test operation is performed by enabling double normal column lines in a second operation mode, since the test operation is performed by enabling not double column lines but only a redundancy column line after a repair operation, a time required for the test operation is lengthened.

SUMMARY

Various embodiments are directed to a semiconductor memory device capable of performing a test operation using double column lines after a repair operation, thereby reducing/minimizing a time required for the test operation.

In an embodiment, a repair circuit may include: a column repair signal generation block suitable for comparing an input address with respective first and second repair addresses in response to a mode control signal, and generating first and second column repair signals; a normal decoder suitable for accessing any one of a first normal column line corresponding to the input address and a second normal column line corresponding to an address which is different in terms of a most significant bit from the input address, in response to the first and second column repair signals; and a redundancy decoder suitable for decoding the first repair address in response to the first and second column repair signals, wherein the second repair address is generated by inverting a most significant bit of the first repair signal.

When the mode control signal is enabled, the column repair signal generation block may compare the input address with the first repair address and enable the first column repair signal when the input address is identical to the first repair address, and compare the input address with the second repair address and enable the second column repair signal when the input address is identical to the second repair address.

The column repair signal generation block may include a first column repair signal generation unit suitable for comparing the input address with the first repair address to generate the first column repair signal; and a second column repair signal generation unit suitable for comparing the input address with the second repair address in response to the mode control signal to generate the second column repair signal.

The repair circuit may further include a first normal control signal generation block suitable for generating a first normal control signal for controlling the normal decoder, in response to the first column repair signal; and a second normal control signal generation block suitable for generating a second normal control signal for controlling the normal decoder, in response to the second column repair signal.

The normal decoder may include a pre-decoder suitable for decoding the input address in response to the mode control signal, and generating a first column decoding signal, a second column decoding signal and a common column decoding signal; a first sub driver suitable for driving the first column decoding signal in response to the first normal control signal; a second sub driver suitable for driving the second column decoding signal in response to the second normal control signal; a common sub driver suitable for driving the common column decoding signal in response to a column strobe signal; a first normal main driver suitable for driving a signal outputted from the first sub driver and a signal outputted from the common sub driver, and selecting the first normal column line corresponding to a driven signal; and a second normal main driver suitable for driving a signal outputted from the second sub driver and a signal outputted from the common sub driver, and selecting the second normal column line corresponding to a driven signal.

The pre-decoder may decode the input address without considering a most significant bit of the input address when the mode control signal is enabled.

The repair circuit may further include a redundancy control signal generation block suitable for generating a redundancy control signal for controlling the redundancy decoder, in response to the first column repair signal and the second column repair signal.

The redundancy decoder may include a redundancy sub driver suitable for driving the redundancy control signal; and a redundancy main driver suitable for selecting a redundancy column line corresponding to a signal outputted from the redundancy sub driver, in response to a column strobe signal.

The first column repair signal generation unit may include a first comparing section suitable for comparing the input address with the first repair address, and outputting a comparison result; and a first merging section suitable for generating the first column repair signal, based on the comparison result outputted from the first comparing section.

The second column repair signal generation unit may include a setting section suitable for inverting the most significant bit of the first repair address when the mode control signal is enabled; a second comparing section suitable for comparing the input address with the most significant bit outputted from the setting section and remaining bits of the first repair address excluding the most significant bit, and outputting a comparison result; and a second merging section suitable for generating the second column repair signal, based on the comparison result outputted from the second comparing section.

When the mode control signal is enabled, the second column repair signal generation unit may compare the input address with the second repair address which is generated by inverting the most significant bit of the first repair address, and output the second column repair signal based on a comparison result and, when the mode control signal is disabled, the second column repair signal generation unit may compare the input address with the first repair address of which the most significant bit is not inverted, and output the second column repair signal based on a comparison result.

In an embodiment, a semiconductor memory device may include: a normal cell array including normal column lines; a redundancy cell array including redundancy column lines; a column repair signal generation block suitable comparing an input address with respective first and second repair addresses in response to a mode control signal, and generating a normal comparison signal and one or more additional comparison signals; a normal decoder suitable for accessing a normal column line corresponding to the input address and a normal column line corresponding to an address which is different in terms of at least one bit from the input address, in response to the normal comparison signal and the additional comparison signals; and a redundancy decoder suitable for decoding the first repair address in response to the normal comparison signal and the additional comparison signals, wherein the second repair addresses is generated by inverting at least one bit of the first repair address.

The column repair signal generation block may include a setting section suitable for respectively inverting the at least one bits of the first repair address when the mode control signal is enabled, and outputting predetermined bits.

The normal decoder may decode the input address without considering the at least one bits of the input address when the mode control signal is enabled.

The semiconductor memory device may further include a normal control signal generation block suitable for generating a plurality of normal control signals for controlling the normal decoder in response to the normal comparison signal and the additional comparison signals.

The semiconductor memory device may further include a redundancy control signal generation block suitable for generating a redundancy control signal for controlling the redundancy decoder in response to the normal comparison signal and the additional comparison signals.

The column repair signal generation block may include a normal comparing section suitable for comparing the input address with the first repair address, and outputting a comparison result; an additional comparing section suitable for comparing the input address with an address which is configured by the predetermined bits outputted from the setting section and remaining bits of the first repair address excluding the predetermined bits, and outputting comparison results; a normal merging section suitable for generating the normal comparison signal based on the comparison result outputted from the normal comparing section; and an additional merging section suitable for generating the one or more additional comparison signals based on the comparison results outputted from the additional comparing section.

In an embodiment, a method for operating a semiconductor memory device including normal column lines and redundancy column lines may include: comparing an input address with a repair address in a first operation mode to access a redundancy column line corresponding to the repair address or a first normal column line corresponding to the input address; comparing the input address with the repair address in a second operation mode; accessing the redundancy column line corresponding to the repair address, and disabling the first normal column line corresponding to the input address and accessing a second normal column line corresponding to an address which is different in terms of a most significant bit from the input address, when the input address is identical to the repair address in the second operation mode; and accessing the first normal column line corresponding to the input address and the second normal column line when the input address is different from the repair address in the second operation mode.

The first operation mode may be a mode for performing a normal operation, and the second operation mode may be a mode for performing a test operation by driving double column lines.

DETAILED DESCRIPTION

Figure 1:
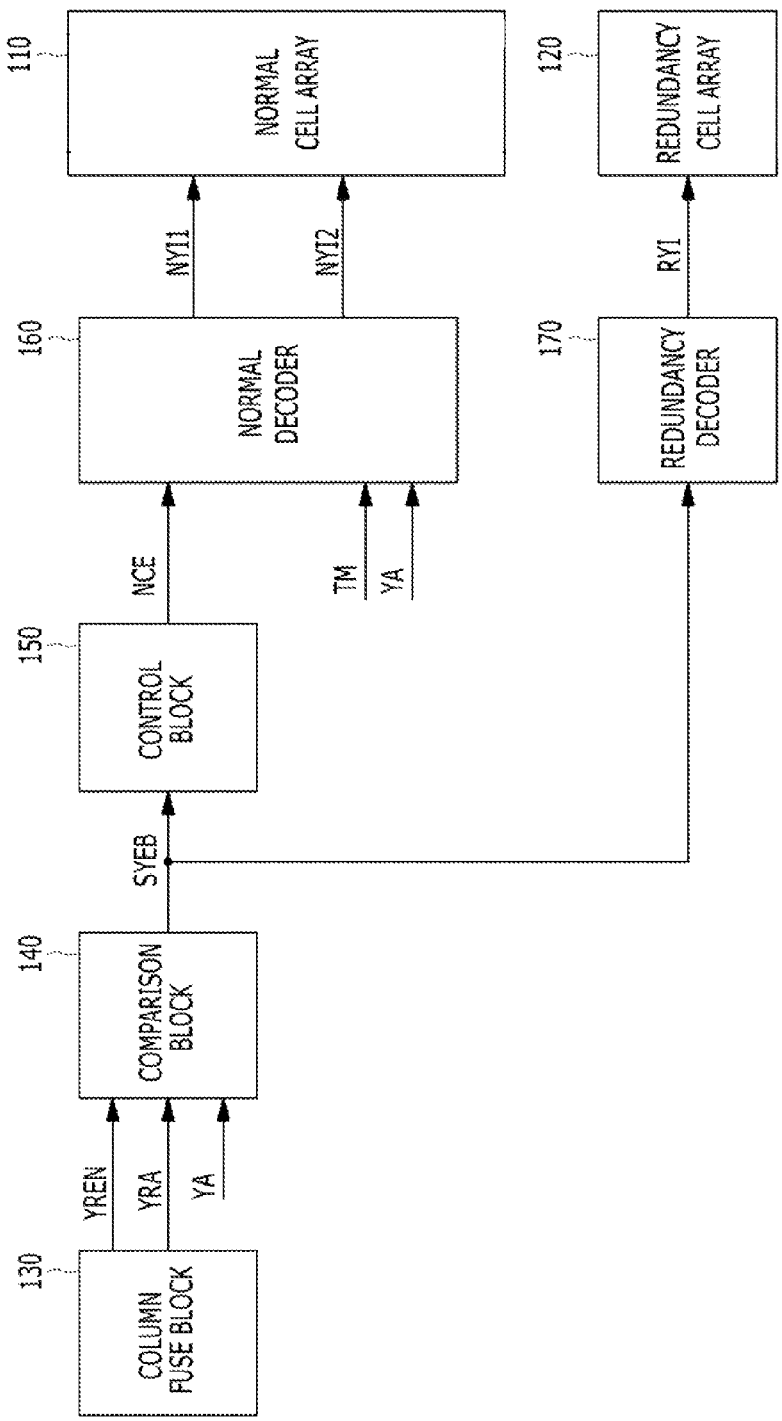
FIG. 1 is a block diagram illustrating a conventional semiconductor memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
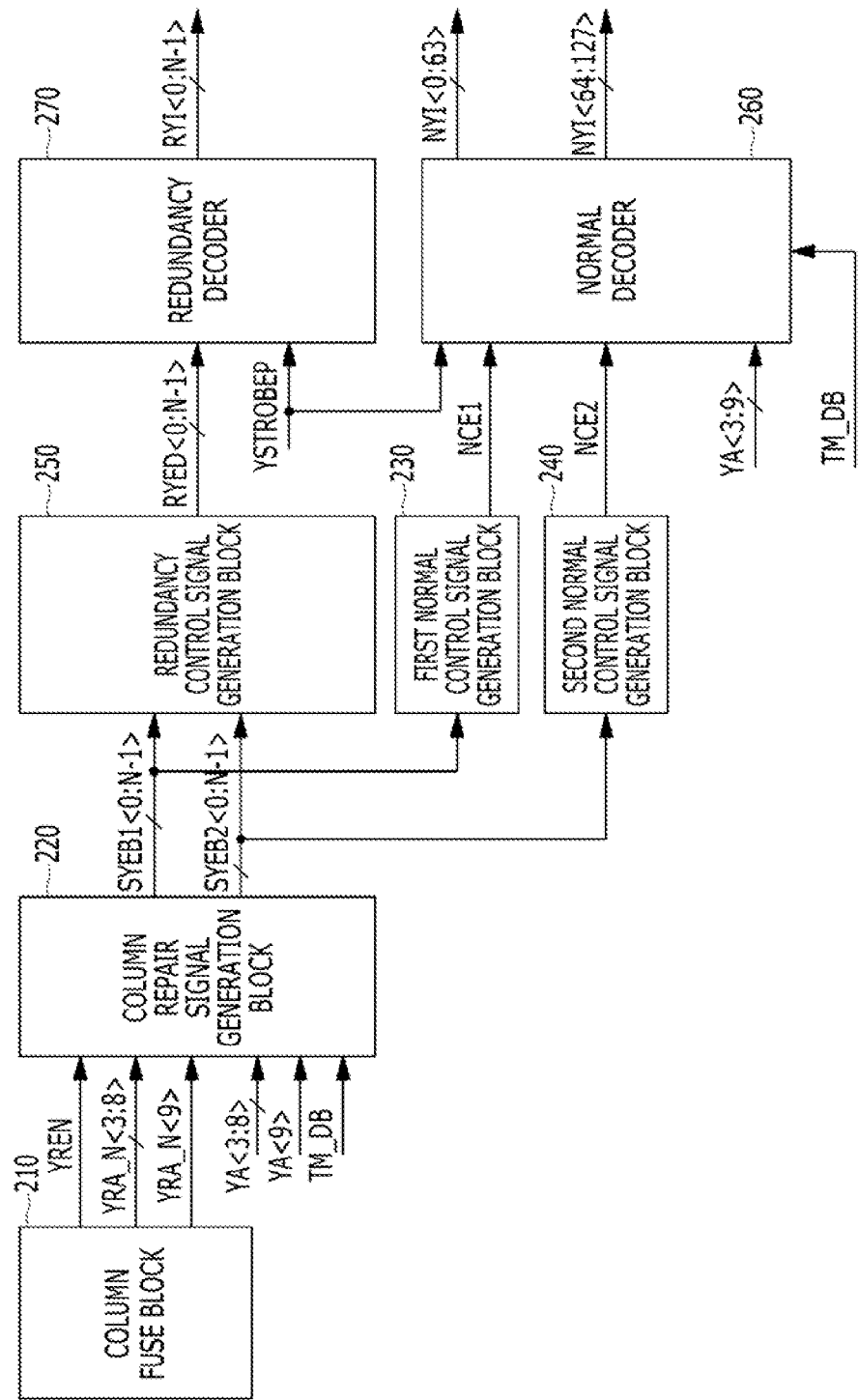
FIG. 2 is a block diagram illustrating a semiconductor memory device in accordance with an embodiment.

FIG. 2 is a block diagram illustrating semiconductor memory device in accordance with an embodiment.

Referring to FIG. 2, the semiconductor memory device may include a column fuse block 210, a column repair signal generation block 220, a first normal control signal generation block 230, a second normal control signal generation block 240, a redundancy control signal generation block 250, a normal decoder 260, and a redundancy decoder 270.

The column fuse block 210 may include a plurality of fuse sets, and output a fuse set enable signal YREN indicating that a defective unit cell exists among a plurality of unit cells, and repair addresses YRA_N<3:9> for replacing column addresses corresponding to the defective unit cell among the plurality of unit cells. In FIG. 2, it is assumed that N fuse sets are provided in the column fuse block 210.

The column repair signal generation block 220 may receive the fuse set enable signal YREN and the repair addresses YRA_N<3:9> from the column fuse block 210. The column repair signal generation block 220 may receive a mode control signal TM_DB and column addresses YA<3:9> from an outside. The semiconductor memory device performs a normal operation in a first operation mode in which the mode control signal TM_DB is disabled. Further, the semiconductor memory device performs a test operation by driving double column lines in a second operation mode in which the mode control signal TM_DB is enabled.

The column repair signal generation block 220 may compare the column addresses YA<3:9> with the repair addresses YRA_N<3:9> and generate first and second column repair signals SYEB1<0:N−1> and SYEB2<0:N−1> based on a comparison result, in the first operation mode. Namely, the column repair signal generation block 220 may compare the column addresses YA<3:9> with the repair addresses YRA_N<3:9> and enable both the first and second column repair signals SYEB1<0:N−1> and SYEB2<0:N−1> when the column addresses YA<3:9> are identical to the repair addresses YRA_N<3:9>, in the first operation mode. Conversely, the column repair signal generation block 220 may compare the column addresses YA<3:9> with the repair addresses YRA_N<3:9> and disable both the first and second column repair signals SYEB1<0:N−1> and SYEB2<0:N−1> when the column addresses YA<3:9> are different from the repair addresses YRA_N<3:9>, in the first operation mode.

The column repair signal generation block 220 may compare the column addresses YA<3:9> with the repair addresses YRA_N<3:9> and generate the first column repair signals SYEB1<0:N−1> or the second column repair signals SYEB2<0:N−1> based on a comparison result, in the second operation mode. The column repair signal generation block 220 may compare the column addresses YA<3:9> with the repair addresses YRA_N<3:9> and enable the first column repair signals SYEB1<0:N−1> when the column addresses YA<3:9> are identical to the repair addresses YRA_N<3:9>, in the second operation mode. Further, the column repair signal generation block 220 may compare repair addresses (not shown) which are generated by inverting only a most significant bit of the repair addresses YRA_N<3:9> with the column addresses YA<3:9> and enable the second column repair signals SYEB2<0:N−1> when the repair addresses are identical to the column addresses YA<3:9>, in the second operation mode.

The first normal control signal generation block 230 may receive the first column repair signals SYEB1<0:N−1> from the column repair signal generation block 220. The first normal control signal generation block 230 may disable a first normal control signal NCE1 in response to the first column repair signals SYEB1<0:N−1>. The first normal control signal NCE1 may be a signal for controlling the normal decoder 260.

The second normal control signal generation block 240 may receive the second column repair signals SYEB2<0:N−1> from the column repair signal generation block 220. The second normal control signal generation block 240 may disable a second normal control signal NCE2 in response to the second column repair signals SYEB2<0:N−1>. The second normal control signal NCE2 may be a signal for controlling the normal decoder 260.

The redundancy control signal generation block 250 may receive the first column repair signals SYEB1<0:N−1> and the second column repair signals SYEB2<0:N−1> from the column repair signal generation block 220. The redundancy control signal generation block 250 may generate redundancy control signals RYED<0:N−1> which are enabled when any one of the first column repair signals SYEB1<0:N−1> and the second column repair signals SYEB2<0:N−1> are enabled.

The normal decoder 260 may receive the first normal control signal NCE1 from the first normal control signal generation block 230 and the second normal control signal NCE2 from the second normal control signal generation block 240. The normal decoder 260 may receive a column strobe signal YSTROBEP, the mode control signal TM_DB and the column addresses YA<3:9> from the outside (e.g. an external source or device).

When the first normal control signal NCE1 and the second normal control signal NCE2 are enabled in the first operation mode, the normal decoder 260 may decode the column addresses YA<3:9> and enable any ones of first normal column select signals NYI<0:63> and second normal column select signals NYI<64:127> corresponding thereto. Further, when the first normal control signal NCE1 and the second normal control signal NCE2 are disabled in the first operation mode, the normal decoder 260 may stop a decoding operation.

When the first normal control signal NCE1 or the second normal control signal NCE2 is enabled in the second operation mode, the normal decoder 260 may decode the column addresses YA<3:9> and enable the first normal column select signals NYI<0:63> or the second normal column select signals NYI<64:127> corresponding to the enabled normal control signal. Further, when the first normal control signal NCE1 and the second normal control signal NCE2 are disabled in the second operation mode, the normal decoder 260 may stop the decoding operation.

The redundancy decoder 270 may output redundancy column select signals RYI<0:N−1> in response to the redundancy control signals RYED<0:N−1> and the column strobe signal YSTOBEP when any one of the first and second column repair signals SYEB1<0:N−1> and SYEB2<0:N−1> are enabled.

Operations of the semiconductor memory device will be described below.

<First Operation Mode>

First, descriptions will be made for the case where the column addresses YA<3:9> are different from the repair addresses YRA_N<3:9>.

The column fuse block 210 may output the fuse set enable signal YREN and the repair addresses YRA_N<3:9> to the column repair signal generation block 220. Further, the column repair signal generation block 220 may receive the column addresses YA<3:9> and the mode control signal TM_DB from the outside. At this time, the mode control signal TM_DB is disabled in the first operation mode. The column repair signal generation block 220 may compare the column addresses YA<3:9> with the repair addresses YRA_N<3:9>. Since the column addresses YA<3:9> are different from the repair addresses YRA_N<3:9>, the column repair signal generation block 220 may output the first and second column repair signals SYEB1<0:N−1> and SYEB2<0:N−1> which are disabled. The first normal control signal generation block 230 and the second normal control signal generation block 240 may receive the first and second column repair signals SYEB1<0:N−1> and SYEB2<0:N−1> which are disabled, and enable the first normal control signal NCE1 and the second normal control signal NCE2, respectively.

In the normal decoder 260, among decoders which respond to the first normal control signal NCE1 and the second normal control signal NCE2, decoders corresponding to the column addresses YA<3:9> may be driven. The normal decoder 260 may decode the column addresses YA<3:9> and enable any one of first normal column select signals NYI<0:63> and second normal column select signals NYI<64:127> corresponding to the column addresses YA<3:9>. The redundancy control signal generation block 250 may disable the redundancy control signals RYED<0:N−1> in response to the first and second column repair signals SYEB1<0:N−1> and SYEB2<0:N−1> which are disabled. In the redundancy decoder 270, decoders are not driven in response to the redundancy control signals RYED<0:N−1> which are disabled.

Second, descriptions will be made for where the column addresses YA<3:9> are identical to the repair addresses YRA_N<3:9>.

Since the column addresses YA<3:9> are identical to the repair addresses YRA_N<3:9> the column repair signal generation block 220 may output the first and second column repair signals SYEB1<0:N−1> and SYEB2<0:N−1> which are enabled. The first normal control signal generation block 230 and the second normal control signal generation block 240 may receive the first and second column repair signals SYEB1<0:N−1> and SYEB2<0:N−1> which are enabled, and disable the first normal control signal NCE1 and the second normal control signal NCE2, respectively.

In the normal decoder 260, decoders are not driven in response to the first normal control signal NCE1 and the second normal control signal NCE2 which are disabled. The redundancy control signal generation block 250 may enable the redundancy control signals RYED<0:N−1> in response to the first and second column repair signals SYEB1<0:N−1> and SYEB2<0:N−1> which are enabled. The redundancy decoder 270 may decode the redundancy control signals RYED<0:N−1> which are enabled, and output the redundancy column select signals RYI<0:N−1>.

<Second Operation Mode>

The column fuse block 210 may output the fuse set enable signal YREN and the repair addresses YRA_N<3:9> to the column repair signal generation block 220. Further, the column repair signal generation block 220 may receive the column addresses YA<3:9> and the mode control signal TM_DB from the outside. At this time, the mode control signal TM_DB is enabled in the second operation mode. The column repair signal generation block 220 may compare the column addresses YA<3:9> and the repair addresses YRA_N<3:9>.

First, descriptions will be made for where the column addresses YA<3:9> are different from the repair addresses YRA_N<3:9>.

For example, when assuming that the column addresses YA<3:9> are '0110000' and the repair addresses YRA_N<3:9> are '1110000', the column repair signal generation block 220 may compare the column addresses YA<3:9> with the repair addresses YRA_N<3:9>, and, since the column addresses YA<3:9> are different from the repair addresses YRA_N<3:9>, the first column repair signal SYEB1<0> may be disabled. Further, the column repair signal generation block 220 may compare repair addresses of '0110000' generated by inverting the most significant bit of the repair addresses YRA_N<3:9> with the column addresses YA<3:9> of '0110000' in response to the mode control signal TM_DB which is enabled, and, since the repair addresses of '0110000' are identical to the column addresses YA<3:9> of '0110000', the second column repair signal SYEB2<0> may be enabled. The first normal control signal generation block 230 may output the first normal control signal NCE1 which is enabled, in response to the first column repair signal SYEB1<0> which is disabled. The second normal control signal generation block 240 may output the second normal control signal NCE2 which is disabled, in response to the second column repair signal SYEB2<0> which is enabled.

The normal decoder 260 decodes the column addresses YA<3:9> without considering the most significant bit of the column addresses YA<3:9> when the mode control signal TM_DB is enabled. The normal decoder 260 may output the first normal column select signals NYI<0:63> by the decoders which are driven in response to the enabled first normal control signal NCE1. The redundancy control signal generation block 250 may enable the redundancy control signal RYED<0>. The redundancy decoder 270 may decode the enabled redundancy control signal RYED<0>, and output the redundancy column select signal RYI<0>.

Accordingly, in the semiconductor memory device, a redundancy column line corresponding to the redundancy column select signal RYI<0> and a normal column line corresponding to the first normal column select signals NYI<0:63> may be enabled.

Second, descriptions will be made for when the column addresses YA<3:9> are identical to the repair addresses YRA_N<3:9>.

For example, when assuming that the column addresses YA<3:9> are '0110000' and the repair addresses YRA_N<3:9> are '0110000', the column repair signal generation block 200 may compare the column addresses YA<3:9> with the repair addresses YRA_N<3:9>, and, since the column addresses YA<3:9> are identical to the repair addresses YRA_N<3:9>, the first column repair signal SYEB1<0> may be enabled. Further, the column repair signal generation block 220 may compare repair addresses of '1110000' generated by inverting the most significant bit of the repair addresses YRA_N<3:9> with the column addresses YA<3:9> of '0110000', and, since the repair addresses are different from the column addresses YA<3:9>, the second column repair signal SYEB2<0> may be disabled. The first normal control signal generation block 230 may output the first normal control signal NCE1 which is disabled, in response to the first column repair signal SYEB1<0> which is enabled. Further, the second normal control signal generation block 240 may output the second normal control signal NCE2 which is enabled, in response to the second column repair signal SYEB2<0> which is disabled.

The normal decoder 260 may decode the column addresses YA<3:9> without considering the most significant bit of the column addresses YA<3:9> in response to the mode control signal TM_DB which is enabled. The normal decoder 260 may stop the decoding operation on the column addresses YA<3:9> in response to the disabled first normal control signal NCE1. Conversely, the normal decoder 260 may enable the decoding operation on the column addresses YA<3:9> in response to the second normal control signal NCE2 which is enabled, and may output the second normal column select signals NYI<64:127> corresponding to the column addresses which are different in terms of only the most significant bit thereof from the column addresses YA<3:9>, when the mode control signal TM_DB is enabled. The redundancy control signal generation block 250 may enable the redundancy control signal RYED<0> in response to the enabled first column repair signal SYEB1<0> and the disabled second column repair signal SYEB2<0>. The redundancy decoder 270 may decode the enabled redundancy control signal RYED<0>, and output the redundancy column select signal RYI<0>.

Accordingly, in the semiconductor memory device, a redundancy column line corresponding to the redundancy column select signal RYI<0> and a normal column line corresponding to the second normal column select signals NYI<64:127> may be enabled.

The semiconductor memory device in accordance with the embodiment may include a column repair signal generation block for inverting a most significant bit of repair addresses and comparing the inverted repair addresses with column addresses. Therefore, where the column addresses correspond to a defective unit cell, the semiconductor memory device may replace the column addresses with the repair addresses and drive a redundancy column line, and may disable a first normal column line which correspond to the column addresses. Further, the semiconductor memory device may compare the inverted repair addresses generated by inverting the most significant bit of the repair addresses with the column addresses, and drive a second normal column line which corresponds to the column addresses. Because the semiconductor memory device may perform a test operation by accessing a redundancy column line and the second normal column line even after a repair operation, the time required for the test operation may be reduced/minimized.

Figure 3:
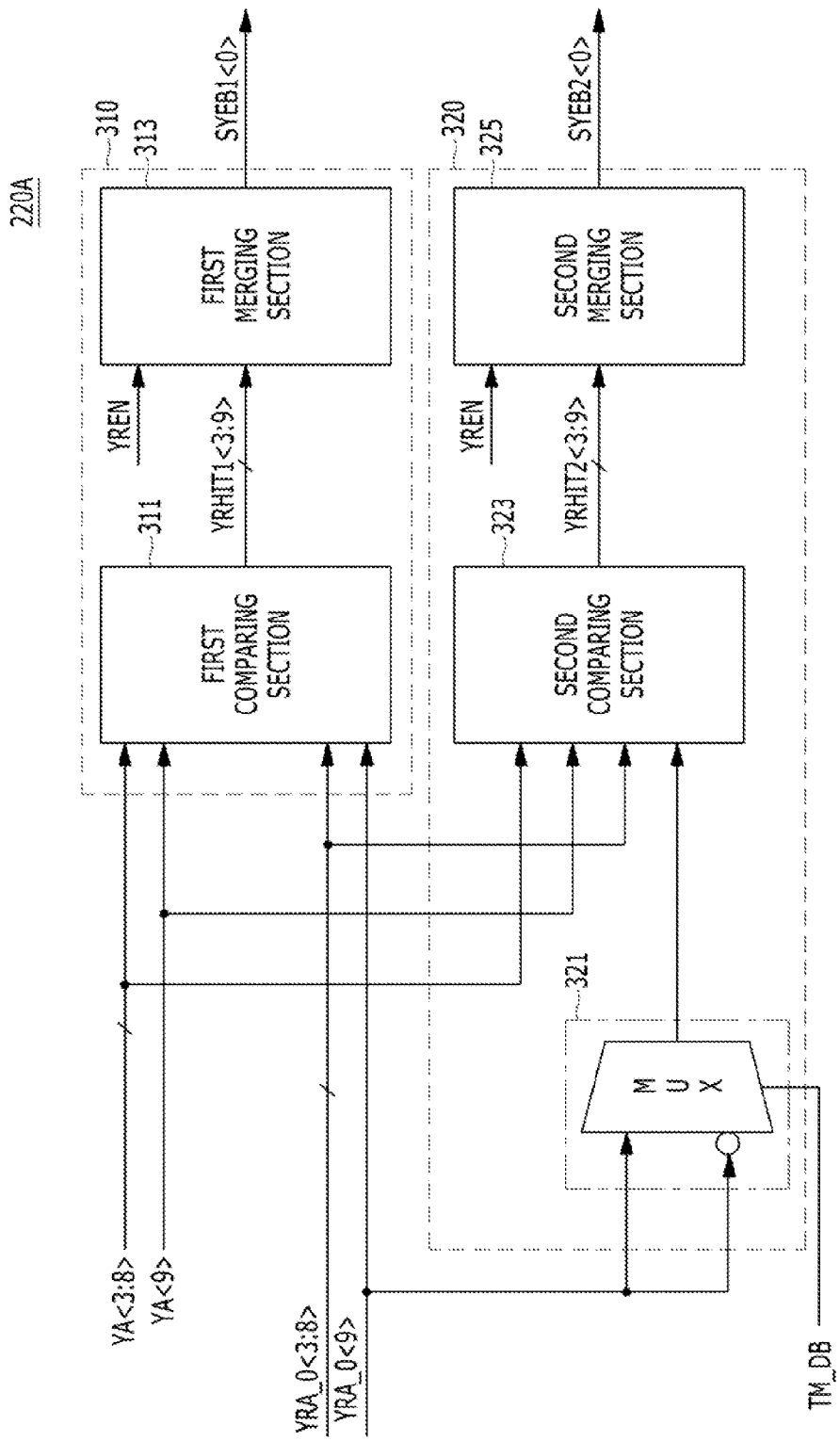
FIG. 3 is a detailed block diagram illustrating a part of a column repair signal generation block shown in FIG. 2.

FIG. 3 is a detailed block diagram illustrating a part 220A of the column repair signal generation block 220 shown in FIG. 2. In FIG. 3, it is assumed that the part 220A of the column repair signal generation block 220 corresponds to a first fuse set among the N fuse sets.

Referring to FIG. 3, the column repair signal generation block may include a first column repair signal generation unit 310 and a second column repair signal generation unit 320.

The first column repair signal generation unit 310 and the second column repair signal generation unit 320 may receive the fuse set enable signal YREN and the repair addresses YRA_0<3:9> from the column fuse block 210 of FIG. 1, and may receive the column addresses YA<3:9> and the mode control signal TM_DB from the outside.

The first column repair signal generation unit 310 may include a first comparing section 311 and a first merging section 313.

The first comparing section 311 may receive the repair addresses YRA_0<3:9> and the column addresses YA<3:9>. The first comparing section 311 may compare the column addresses YA<3:9> with the repair addresses YRA_0<3:9>, and output first comparison results YHIT1<3:9>.

The first merging section 313 may receive and merge the first comparison results YHIT1<3:9> and output the first column repair signal SYEB1<0>, when the fuse set enable signal YREN is enabled. The first merging section 313 may output the first column repair signal SYEB1<0> which has a low level, where all the first comparison results YHIT1<3:9> are identical to each other.

The second column repair signal generation unit 320 may include a setting section 321, a second comparing section 323 and a second merging section 325.

The setting section 321 may receive the mode control signal TM_DB and the most significant bit YRA_0<9> of the repair addresses YRA_0<3:9>, and output a set address. The setting section 321 may be configured by a multiplexer MUX. The multiplexer MUX may output the set address by selecting one of the most significant bit YRA_0<9> of the repair addresses YRA_0<3:9> and an inverted signal of the most significant bit YRA_0<9>, through the input terminals thereof, in response to the mode control signal TM_DB serving as a control signal for controlling the multiplexer MUX. When the mode control signal TM_DB is enabled, the multiplexer MUX may output the set address by selecting the inverted signal of the most significant bit YRA_0<9>. Conversely, when the mode control signal TM_DB is disabled, the multiplexer MUX may output the set address by selecting the most significant bit YRA_0<9> that is not inverted.

The second comparing section 323 may receive the column addresses YA<3:9>, remaining repair addresses YRA_0<3:8> excluding the most significant bit YRA_0<9> and the set address outputted from the setting section 321. The second comparing section 323 may compare remaining column addresses YA<3:8> excluding the most significant bit YA<9> with the remaining repair addresses YRA_0<3:8> excluding the most significant bit YRA_0<9>, compare the most significant bit YA<9> of the column addresses YA<3:9> with the set address outputted from the setting section 321, and output second comparison results YHIT2<3:9>. In other words, the second comparing section 323 may compare repair addresses which are generated by inverting the most significant bit of the repair addresses YRA_0<3:9> with the column addresses YA<3:9> when the mode control signal TM_DB is enabled. Conversely, the second comparing section 323 may compare the column addresses YA<3:9> with the repair addresses YRA_0<3:9> of which the most significant bit is not inverted when the mode control signal TM_DB is disabled.

The second merging section 325 may receive and merge the second comparison results YHIT2<3:9> and output the second column repair signal SYEB2<0>, when the fuse set enable signal YREN is enabled. The second merging section 325 may output the second column repair signal SYEB2<0> which has a low level, when all the second comparison results YHIT2<3:9> are identical to each other.

For example, it is assumed that the column addresses YA<3:9> received from the outside are '0110000' and the repair addresses YRA_0<3:9> are '0110000'.

In the first operation mode in which the mode control signal TM_DB is disabled, since the column addresses YA<3:9> of '0110000' are identical to the repair addresses YRA_0<3:9> of '0110000', the first column repair signal generation unit 310 may generate the first column repair signal SYEB1<0> which is enabled, meaning that the column addresses YA<3:9> correspond to a defective memory cell, based on a comparison result. The setting section 321 of the second column repair signal generation unit 320 does not invert the most significant bit of the repair addresses YRA_0<3:9> of '0110000' in response to the mode control signal TM_DB which is disabled. The second comparing section 323 may receive and compare the column addresses YA<3:9> of '0110000' with the repair addresses '0110000' which are configured by the most significant bit of the repair addresses YRA_0<3:9>, outputted from the setting section 321, and the remaining bits of the repair addresses YRA_0<3:9>. Since the column addresses YA<3:9> of '0110000' are identical to the repair addresses '0110000', the second column repair signal generation unit 320 may generate the second column repair signal SYEB2<0> which is enabled.

In the second operation mode in which the mode control signal TM_DB is enabled, since the column addresses YA<3:9> of '0110000' are identical to the repair addresses YRA_0<3:9> of '0110000', the first column repair signal generation unit 310 may generate the first column repair signal SYEB1<0> which is enabled, meaning that the column addresses YA<3:9> correspond to a defective memory cell, based on a comparison result. Conversely, the setting section 321 of the second column repair signal generation unit 320 may invert and set the most significant bit of the repair addresses YRA_0<3:9> of '0110000' in response to the mode control signal TM_DB which is enabled. The second comparing section 323 may compare the column addresses YA<3:9> of '0110000' with repair addresses of '1110000', which are configured by the inverted signal of the most significant bit of the repair addresses YRA_0<3:9>, outputted from the setting section 321, and the remaining bits of the repair addresses YRA_0<3:9>. Since the column addresses YA<3:9> of '0110000' are different from the repair addresses '1110000', the second column repair signal generation unit 320 may generate the second column repair signal SYEB2<0> which is disabled.

In the second operation mode, the column repair signal generation block may disable both the first column repair signal SYEB1<0> and the second column repair signal SYEB2<0> when the repair addresses YRA_0<3:9> are different from the column addresses YA<3:9>. The column repair signal generation block may enable only the first column repair signal SYEB1<0> when the repair addresses YRA_0<3:9> are identical to the column addresses YA<3:9>. Moreover, the column repair signal generation block may enable only the second column repair signal SYEB2<0> when the repair addresses YRA_0<3:9> are identical to other column addresses, which are different in terms of only the most significant bit from the column addresses YA<3:9>. Therefore, when the second column repair signal SYEB2<0> is enabled, it may mean that, in a double column test operation, not a first normal column line corresponding to the column addresses YA<3:9> but a second normal column line corresponding to other column addresses, which are different in terms of only the most significant bit from the column addresses YA<3:9>, have failed.

Figure 4:
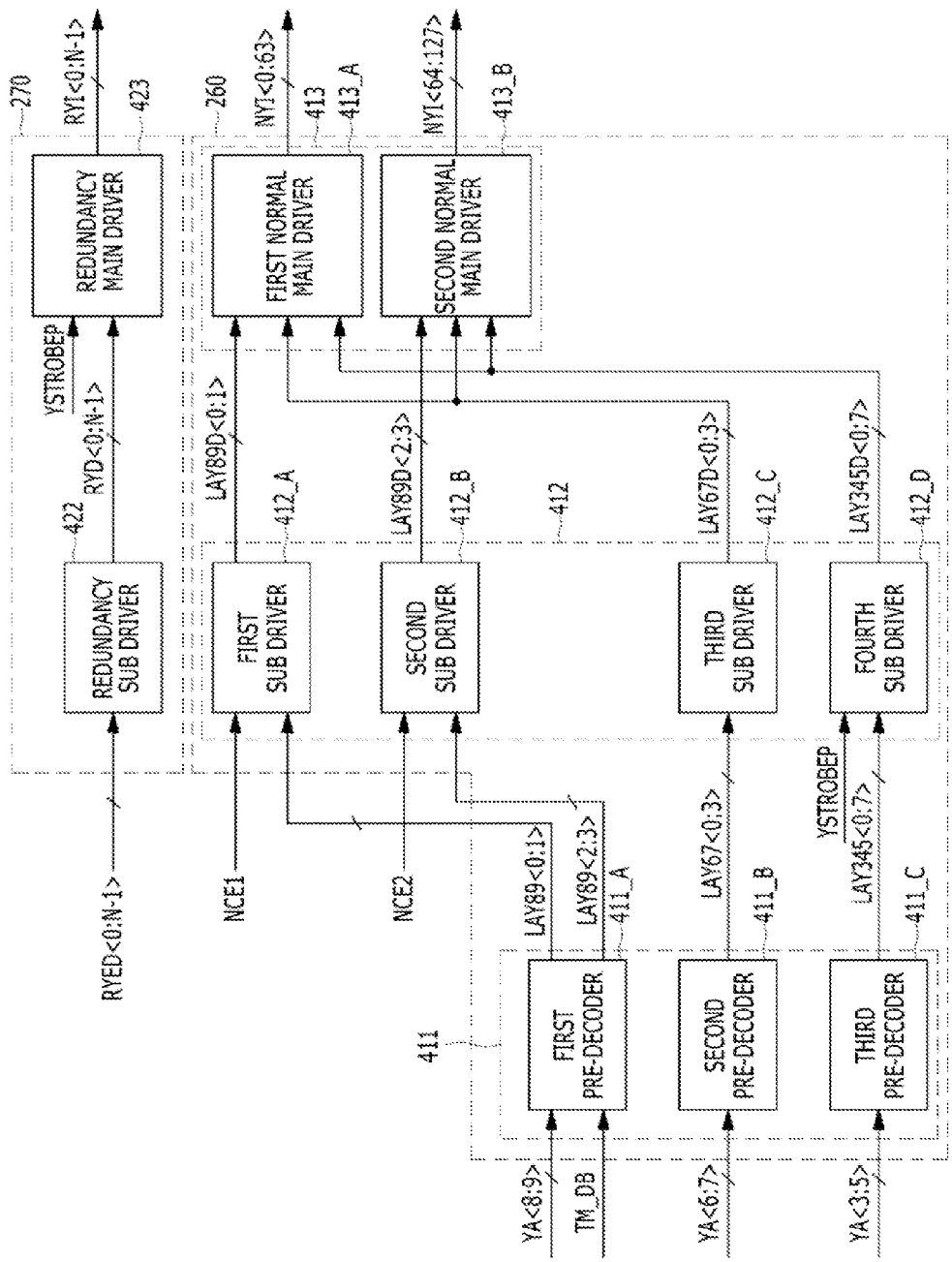
FIG. 4 is a detailed block diagram illustrating a redundancy decoder and a normal decoder shown in FIG. 2.

FIG. 4 is a detailed block diagram illustrating the redundancy decoder 270 and the normal decoder 260 shown in FIG. 2.

Referring to FIG. 4, the normal decoder 260 may include a pre-decoder group 411, a sub driver group 412, and a normal main driver group 413.

The pre-decoder group 411 may include first to third pre-decoders 411_A, 411_B and 411_C.

The first pre-decoder 411_A may receive the mode control signal TM_DB and the eighth and ninth bits YA<8:9> of the column addresses YA<3:9>. The first pre-decoder 411_A may decode the eighth and ninth bits YA<8:9> and output column decoding signals LAY89<0:3>, in response to the mode control signal TM_DB.

In detail, the first pre-decoder 411_A may decode the eighth and ninth bits YA<8:9> and output the column decoding signals LAY89<0:3> when the mode control signal TM_DB is disabled. When the mode control signal TM_DB is enabled, the first pre-decoder 411_A may decode the eighth and ninth bits YA<8:9> without considering the ninth bit as the most significant bit, and output the column decoding signals LAY89<0:3>. The first pre-decoder 411_A may output a first part LAY89<0:1> of the column decoding signals LAY89<0:3> to a first sub driver 412_A, and a second part LAY89<2:3> of the column decoding signals LAY89<0:3> to a second sub driver 412_B.

The second pre-decoder 411_B may receive the sixth and seventh bits YA<6:7> of the column addresses YA<3:9>. The second pre-decoder 411_B may decode the sixth and seventh bits YA<6:7> and output column decoding signals LAY67<0:3>.

The third pre-decoder 411_C may receive the third to fifth bits YA<3:5> of the column addresses YA<3:9>. The third pre-decoder 411_C may decode the third, to fifth bits YA<3:5> and output column decoding signals LAY345<0:7>.

The sub driver group 412 may include first to fourth sub drivers 412_A, 412_B, 412_C and 412_D.

The first sub driver 412_A may receive the first normal control signal NCE1 and the first part LAY89<0:1> of the column decoding signals LAY89<0:3> from the first pre-decoder 411_A. The first sub driver 412_A may receive and drive the first part LAY89<0:1> of the column decoding signals LAY89<0:3> and output first column decoding delay signals LAY89D<0:1>, during a period in which the first normal control signal NCE1 is enabled.

The second sub driver 412_B may receive the second normal control signal NCE2 and the second part LAY89<2:3> of the column decoding signals LAY89<0:3> from the first pre-decoder 411_A. The second sub driver 412_B may receive and drive the second part LAY89<2:3> of the column decoding signals LAY89<0:3> and output second column decoding delay signals LAY89D<2:3>, during a period in which the second normal control signal NCE2 is enabled.

The third sub driver 412_C may receive the column decoding signals LAY67<0:3> from the second pre-decoder 411_B. The third sub driver 412_C may drive the column decoding signals LAY67<0:3> and output third column decoding delay signals LAY67D<0:3>.

The fourth sub driver 412_D may receive the column strobe signal YSTROBEP and the column decoding signals LAY345<0:7> from the third pre-decoder 411_C. The fourth sub driver 412_D may drive the column decoding signals LAY345<0:7> and output fourth column decoding delay signals LAY345D<0:7>.

The normal main driver group 413 may include a first normal main driver 413_A and a second normal main driver 413_B.

The first normal main driver 413_A may receive the first column decoding delay signals LAY89D<0:1> outputted from the first sub driver 412_A and the third and fourth column decoding delay signals LAY67D<0:3> and LAY345D<0:7> outputted from the third and fourth sub drivers 412_C and 412_D, respectively. The first normal main driver 413_A may output the first normal column select signals NYI<0:63> in response to the first, third and fourth column decoding delay signals LAY89D<0:1>, LAY67D<0:3> and LAY345D<0:7>.

In response to the first normal column select signals NYI<0:63> outputted from the first normal main driver 413_A, a normal column line corresponding thereto may be enabled.

The second normal main driver 413_B may receive the second column decoding delay signals LAY89D<2:3> outputted from the second sub driver 412_B and the third and fourth column decoding delay signals LAY67D<0:3> and LAY345D<0:7> outputted from the third and fourth sub drivers 412_C and 412_D, respectively. The second normal main driver 413_B may output the second normal column select signals NYI<64:127> in response to the second to third column decoding delay signals LAY89D<2:3>, LAY67D<0:3> and LAY345D<0:7>.

For reference, the third and fourth sub drivers 412_C and 412_D may be common sub drivers because they commonly output the third and fourth column decoding delay signals LAY67D<0:3> and LAY345D<0:7> to the first and second normal main drivers 413_A and 413_B, respectively.

In response to the second normal column select signals NYI<64:127> outputted from the second normal main driver 413_B, a normal column line corresponding thereto may be enabled.

The redundancy decoder 270 may include a redundancy sub driver 422 and a redundancy main driver 423.

The redundancy sub driver 422 may receive the redundancy control signals RYED<0:N−1>. The redundancy sub driver 422 may drive the redundancy control signals RYED<0:N−1> and output redundancy column delay signals RYD<0:N−1>.

The redundancy main driver 423 may receive the redundancy column delay signals RYD<0:N−1> outputted from the redundancy sub driver 422 and the column strobe signal YSTROBEP. The redundancy main driver 423 may drive the redundancy column delay signals RYD<0:N−1> and output the redundancy column select signals RYI<0:N−1>, in response to the column strobe signal YSTROBEP.

In response to the redundancy column select signals RYI<0:N−1> outputted from the redundancy main driver 423, a redundancy column line corresponding thereto may be enabled.

Figure 5:
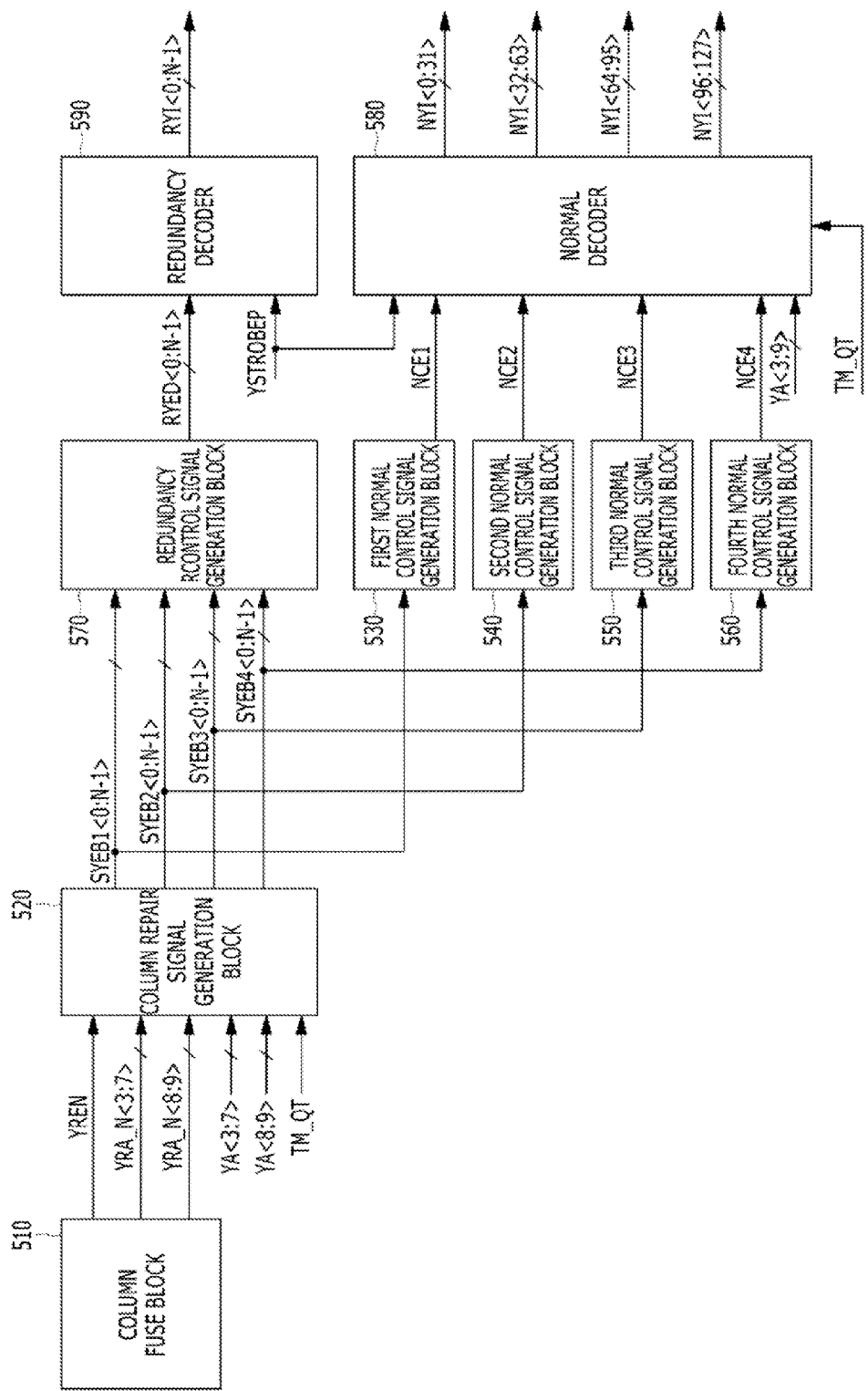
FIG. 5 is a block diagram illustrating a semiconductor memory device in accordance with an embodiment.

FIG. 5 is a block diagram illustrating a semiconductor memory device in accordance with an embodiment.

Referring to FIG. 5, the semiconductor memory device may include a column fuse block 510, a column repair signal generation block 520, first to fourth normal control signal generation blocks 530 to 560, a redundancy control signal generation block 570, a normal decoder 580, and a redundancy decoder 590.

The column fuse block 510 may include a plurality of fuse sets, and output a fuse set enable signal YREN indicating that a defective unit cell exists among a plurality of unit cells, and repair addresses YRA_N<3:9> for replacing column addresses corresponding to the defective unit cell among the plurality of unit cells.

The column repair signal generation block 520 may receive the fuse set enable signal YREN and the repair addresses YRA_N<3:9> from the column fuse block 510. The column repair signal generation block 520 may receive a mode control signal TM_QT and column addresses YA<3:9> from outside. The semiconductor memory device performs a normal operation in a first operation mode in which the mode control signal TM_QT is disabled. Further, the semiconductor memory device performs a test operation by driving four column lines in a second operation mode in which the mode control signal TM_QT is enabled.

The column repair signal generation block 520 may compare the column addresses YA<3:9> with the repair addresses YRA_N<3:9> and generate first to fourth column repair signals SYEB1<0:N−1>, SYEB2<0:N−1>, SYEB3<0:N−1> and SYEB4<0:N−1> based on a comparison result, in the first operation mode. Namely, the column repair signal generation block 520 may compare the column addresses YA<3:9> with the repair addresses YRA_N<3:9> and enable all the first to fourth column repair signals SYEB1<0:N−1>, SYEB2<0:N−1>, SYEB3<0:N−1> and SYEB4<0:N−1> when the column addresses YA<3:9> are identical to the repair addresses YRA_N<3:9>, in the first operation mode. Conversely, the column repair signal generation block 520 may compare the column addresses YA<3:9> with the repair addresses YRA_N<3:9> and disable all the first to fourth column repair signals SYEB1<0:N−1>, SYEB2<0:N−1>, SYEB3<0:N−1> and SYEB4<0:N−1> when the column addresses YA<3:9> are different from the repair addresses YRA_N<3:9>, in the first operation mode.

The column repair signal generation block 520 may compare the column addresses YA<3:9> with the repair addresses YRA_N<3:9> and individually generate the first to fourth column repair signals SYEB1<0:N−1>, SYEB2<0:N−1>, SYEB3<0:N−1> and SYEB4<0:N−1> based on a comparison result, in the second operation mode.

That is, the column repair signal generation block 520 may compare the column addresses YA<3:9> with the repair addresses YRA_N<3:9> and enable the first column repair signals SYEB1<0:N−1> when the column addresses YA<3:9> are identical to the repair addresses YRA_N<3:9> in the second operation mode. The column repair signal generation block 520 may compare the column addresses YA<3:9> with repair addresses which are generated by inverting the ninth bit, as the most significant bit, of the repair addresses YRA_N<3:9>, and enable the second column repair signals SYEB2<0:N−1> when the repair addresses are identical to the column addresses YA<3:9>, in the second operation mode. The column repair signal generation block 520 may compare the column addresses YA<3:9> with repair addresses which are generated by inverting the eighth bit of the repair addresses YRA_N<3:9>, and enable the third column repair signals SYEB3<0:N−1> when the repair addresses are identical to the column addresses YA<3:9>, in the second operation mode. Further, the column repair signal generation block 520 may compare the column addresses YA<3:9> with repair addresses which are generated by inverting the eighth and ninth bits of the repair addresses YRA_N<3:9>, and enable the fourth column repair signals SYEB4<0:N−1> when the repair addresses are identical to the column addresses YA<3:9> correspond to each other, in the case of the second operation mode.

In an embodiment, the column repair signal generation block 520 may include a setting section (not shown) for respectively inverting predetermined bits, e.g., the eighth and ninth bits of the repair addresses YRA_N<3:9>, in the second operation mode in which the mode control signal TM_QT is enabled. Further, though not illustrated in FIG. 5, the column repair signal generation block 520 may include a normal comparing section for comparing the column addresses YA<3:9> with the repair addresses YRA_N<3:9>, and outputting a comparison result, an additional comparing section for comparing the column addresses YA<3:9> with addresses which are configured by the predetermined bits, e.g., the eighth and ninth bits of the repair addresses YRA_N<3:9>, outputted from the setting section and remaining bits of the repair addresses YRA_N<3:9> excluding the predetermined bits, and outputting comparison results, a normal merging section for generating the first column repair signal SYEB1<0:N−1> based on the comparison result outputted from the normal comparing section, and an additional merging section for generating the second to fourth column repair signals SYEB2<0:N−1>, SYEB3<0:N−1> and SYEB4<0:N−1> based on the comparison results outputted from the additional comparing section.

The first normal control signal generation block 530 may receive the first column repair signals SYEB1<0:N−1> from the column repair signal generation block 520. The first normal control signal generation block 530 may generate a first normal control signal NCE1 in response to the first column repair signals SYEB1<0:N−1>. The first normal control signal NCE1 may be a signal for controlling a decoding operation of the normal decoder 580. Therefore, when the first column repair signals SYEB1<0:N−1> are enabled, the first normal control signal NCE1 corresponding thereto may be disabled.

Similarly to the first normal control signal generation block 530, the second to fourth normal control signal generation blocks 540 to 560 may respectively receive the second to fourth column repair signals SYEB2<0:N−1> SYEB3<0:N−1> and SYEB4<0:N−1> from the column repair signal generation block 520. The second to fourth normal control signal generation blocks 540 to 560 may generate second to fourth normal control signals NCE2, NCE3 and NCE4 in response to the second to fourth column repair signals SYEB2<0:N−1>, SYEB3<0:N−1> and SYEB4<0:N−1>, respectively. The second to fourth normal control signals NCE2, NCE3 and NCE4 may be signals for the controlling operation of the normal decoder 580. In the case where the second to fourth column repair signals SYEB2<0:N−1>, SYEB3<0:N−1> and SYEB4<0:N−1> are enabled, the second to fourth normal control signals NCE2, NCE3 and NCE4 corresponding thereto may be disabled.

The redundancy control signal generation block 570 may receive the first to fourth column repair signals SYEB1<0:N−1>, SYEB2<0:N−1>, SYEB3<0:N−1> and SYEB4<0:N−1> from the column repair signal generation block 520. The redundancy control signal generation block 570 may generate redundancy control signals RYED<0:N−1> which are enabled when any one of the first to fourth column repair signals SYEB1<0:N−1>, SYEB2<0:N−1, SYEB3<0:N−1> and SYEB4<0:N−1> are enabled.

The normal decoder 580 may receive the first to fourth normal control signals NCE1, NCE2, NCE3 and NCE4 from the first to fourth normal control signal generation blocks 530 to 560. The normal decoder 580 may receive a column strobe signal YSTROBEP, the mode control signal TM_QT and the column addresses YA<3:9> from outside. While not shown, the normal decoder 580 may include decoders which are driven in response to the first to fourth normal control signals NCE1, NCE2, NCE3 and NCE4, respectively.

When all the first to fourth normal control signals NCE1, NCE2, NCE3 and NCE4 are enabled in the first operation mode in which the mode control signal TM_QT is disabled, the normal decoder 580 may decode the column addresses YA<3:9> and enable any one of first to fourth normal column select signals NYI<0:31>, NYI<32:63>, NYI<64:95> and NYI<96:127> corresponding thereto. Further, when all the first to fourth normal control signals NCE1, NCE2, NCE3 and NCE4 are disabled in the first operation mode, the normal decoder 580 may stop the decoding operation.

When any one of the first to fourth normal control signals NCE1, NCE2, NCE3 and NCE4 is enabled in the second operation mode in which the mode control signal TM_QT is enabled, the normal decoder 580 may decode the column addresses YA<3:9> and enable the first to fourth normal column select signals NYI<0:31>, NYI<32:63>, NYI<64:95> and NYI<96:127> corresponding to the enabled normal control signal.

Conversely, when the first to fourth normal control signals NCE1, NCE2, NCE3 and NCE4 are disabled, decoders corresponding to the disabled normal control signals NCE1, NCE2, NCE3 and NCE4 may be disabled. Therefore, the first to fourth normal column select signals NYI<0:31>, NYI<32:63>, NYI<64:95> and NYI<96:127> may be enabled in response to the enabled normal control signals.

The redundancy decoder 590 may output redundancy column select signals RYI<0:N−1> in response to the redundancy control signals RYED<0:N−1> and the column strobe signal YSTROBEP when any one of the first to fourth column repair signals SYEB1<0:N−1>, SYEB2<0:N−1>, SYEB3<0:N−1> and SYEB4<0:N−1> are enabled.

The semiconductor memory device in accordance with the embodiment may include a column repair signal generation block for inverting predetermined bits of repair addresses and comparing the inverted repair addresses with column addresses, and may further include the first to fourth normal control signal generation units 530 to 560 which generate control signals for accessing normal column lines in response to the first to fourth column repair signals SYEB1<0:N−1>, SYEB2<0:N−1>, SYEB3<0:N−1> and SYEB4<0:N−1> corresponding to comparison results. Therefore, when the column addresses correspond to a defective unit cell, the semiconductor memory device may replace the column addresses with the repair addresses and drive a redundancy column line, and may disable a first normal column line which correspond to the column addresses. Further, the semiconductor memory device may compare repair addresses generated by inverting the predetermined bits of the repair addresses with the column addresses, and drive second to fourth normal column lines which correspond to the column addresses. Accordingly, because the semiconductor memory device may perform a test operation by accessing a redundancy column line and the second to fourth normal column lines even after a repair operation, the time required for the test operation may be reduced/minimized.

Therefore, in an embodiment, between a first normal column line corresponding to column addresses and a second normal column line corresponding to column addresses which are different in only the most significant bit from the column addresses of the first normal column line, the first normal column line is repaired in a double column test operation, and a test operation may be performed even for the second normal column line.

Further, since it is possible to perform a test operation by accessing double column lines even after a repair operation, the time required to perform the test operation may be reduced/minimized.

Although various embodiments have been described for illustrative purposes, it will be apparent to those skilled in the art that various changes and modifications may be made without departing from the spirit and scope of the invention as defined in the following claims.

For instance, positioning, logic gate types, and transistors described in the embodiments above could be realized differently depending on the polarity of the inputted signals.

What is claimed is:

1. A repair circuit comprising:
   a column repair signal generation block suitable for comparing an input address with first and second repair addresses in response to a mode control signal, and generating first and second column repair signals;
   a normal decoder suitable for accessing any one of a first normal column line corresponding to the input address and a second normal column line corresponding to an address that is different from the input address in terms of a most significant bit, in response to the first and second column repair signals; and
   a redundancy decoder suitable for decoding the first repair address in response to the first and second column repair signals,
   wherein the second repair address is generated by inverting a most significant bit of the first repair signal.

2. The repair circuit according to claim 1, wherein, when the mode control signal is enabled, the column repair signal generation block compares the input address with the first repair address and enables the first column repair signal when the input address is identical to the first repair address, and compares the input address with the second repair address and enables the second column repair signal when the input address is identical to the second repair address.

3. The repair circuit according to claim 1, wherein the column repair signal generation block comprises:
   a first column repair signal generation unit suitable for comparing the input address with the first repair address to generate the first column repair signal; and
   a second column repair signal generation unit suitable for comparing the input address with the second repair address in response to the mode control signal to generate the second column repair signal.

4. The repair circuit according to claim 3, further comprising:
   a first normal control signal generation block suitable for generating a first normal control signal for controlling the normal decoder, in response to the first column repair signal; and
   a second normal control signal generation block suitable for generating a second normal control signal for controlling the normal decoder, in response to the second column repair signal.

5. The repair circuit according to claim 4, wherein the normal decoder comprises:
- a pre-decoder suitable for decoding the input address in response to the mode control signal, and generating a first column decoding signal, a second column decoding signal and a common column decoding signal;
- a first sub driver suitable for driving the first column decoding signal in response to the first normal control signal;
- a second sub driver suitable for driving the second column decoding signal in response to the second normal control signal;
- a common sub driver suitable for driving the common column decoding signal in response to a column strobe signal;
- a first normal main driver suitable for driving a signal outputted from the first sub driver and a signal outputted from the common sub driver, and selecting the first normal column line corresponding to a driven signal; and
- a second normal main driver suitable for driving a signal outputted from the second sub driver and a signal outputted from the common sub driver, and selecting the second normal column line corresponding to a driven signal.

6. The repair circuit according to claim 5, wherein the pre-decoder decodes the input address without considering a most significant bit of the input address when the mode control signal is enabled.

7. The repair circuit according to claim 3, further comprising:
- a redundancy control signal generation block suitable for generating a redundancy control signal for controlling the redundancy decoder, in response to the first column repair signal and the second column repair signal.

8. The repair circuit according to claim 7, wherein the redundancy decoder comprises:
- a redundancy sub driver suitable for driving the redundancy control signal; and
- a redundancy main driver suitable for selecting a redundancy column line corresponding to a signal outputted from the redundancy sub driver, in response to a column strobe signal.

9. The repair circuit according to claim 3, wherein the first column repair signal generation unit comprises:
- a first comparing section suitable for comparing the input address with the first repair address, and outputting a comparison result; and
- a first merging section suitable for generating the first column repair signal, based on the comparison result outputted from the first comparing section.

10. The repair circuit according to claim 3, wherein the second column repair signal generation unit comprises:
- a setting section suitable for inverting the most significant bit of the first repair address when the mode control signal is enabled;
- a second comparing section suitable for comparing the input address with the most significant bit outputted from the setting section and remaining bits of the first repair address excluding the most significant bit, and outputting a comparison result; and
- a second merging section suitable for generating the second column repair signal, based on the comparison result outputted from the second comparing section.

11. The repair circuit according to claim 10,
wherein, when the mode control signal is enabled, the second column repair signal generation unit compares the input address with the second repair address that is generated by inverting the most significant bit of the first repair address, and outputs the second column repair signal based on a comparison result, and
wherein, when the mode control signal is disabled, the second column repair signal generation unit compares the input address with the first repair address of which the most significant bit is not inverted, and outputs the second column repair signal based on a comparison result.

12. A semiconductor memory device comprising:
- a normal cell array including normal column lines;
- a redundancy cell array including redundancy column lines;
- a column repair signal generation block suitable for comparing an input address with respective first and second repair addresses in response to a mode control signal, and generating a normal comparison signal and one or more additional comparison signals;
- a normal decoder suitable for accessing a normal column line corresponding to the input address and a normal column line corresponding to an address that is different in terms of at least one bit from the input address, in response to the normal comparison signal and the additional comparison signals; and
- a redundancy decoder suitable for decoding the first repair address in response to the normal comparison signal and the additional comparison signals,
wherein the second repair address is generated by inverting at least one bit of the first repair address.

13. The semiconductor memory device according to claim 12, wherein the column repair signal generation block comprises:
- a setting section suitable for inverting the at least one bits of the first repair address when the mode control signal is enabled, and outputting predetermined bits.

14. The semiconductor memory device according to claim 12, wherein the normal decoder decodes the input address without considering the at least one bits of the input address when the mode control signal is enabled.

15. The semiconductor memory device according to claim 12, further comprising:
- a normal control signal generation block suitable for generating a plurality of normal control signals for controlling the normal decoder in response to the normal comparison signal and the additional comparison signals.

16. The semiconductor memory device according to claim 12, further comprising:
- a redundancy control signal generation block suitable for generating a redundancy control signal for controlling the redundancy decoder in response to the normal comparison signal and the additional comparison signals.

17. The semiconductor memory device according to claim 13, wherein the column repair signal generation block further comprises:
- a normal comparing section suitable for comparing the input address with the first repair address, and outputting a comparison result;
- an additional comparing section suitable for comparing the input address with an address that is configured by the predetermined bits outputted from the setting section and remaining bits of the first repair address excluding the predetermined bits, and outputting comparison results;
- a normal merging section suitable for generating the normal comparison signal based on the comparison result outputted from the normal comparing section; and an additional merging section suitable for generating the one or more additional comparison signals based on the comparison results outputted from the additional comparing section.

18. A method of operating a semiconductor memory device including normal column lines and redundancy column lines, the method comprising:
- comparing an input address with a repair address in a first operation mode to access redundancy column line corresponding to the repair address or a first normal column line corresponding to the input address;
- comparing the input address with the repair address in a second operation mode;
- accessing the redundancy column line corresponding to the repair address, and disabling the first normal column line corresponding to the input address and accessing a second normal column line corresponding to an address that is different in terms of a most significant bit from the input address, when the input address is identical to the repair address in the second operation mode; and
- accessing the first normal column line corresponding to the input address and the second normal column line, when the input address is different from the repair address in the second operation mode.

19. The method according to claim 18, wherein the first operation mode is a mode for performing a normal operation, and the second operation mode is a mode for performing a test operation by driving double column lines.

\* \* \* \* \*